United States Patent [19]
Ozeki et al.

[11] Patent Number: 5,402,385
[45] Date of Patent: Mar. 28, 1995

[54] MEMORY CARD

[75] Inventors: Tomotaka Ozeki, Toride; Yuzou Matsuo, Ibaraki, both of Japan

[73] Assignee: Hitachi Maxell, Ltd., Ibaraki, Japan

[21] Appl. No.: 12,748

[22] Filed: Feb. 3, 1993

[30] Foreign Application Priority Data

Feb. 5, 1992 [JP] Japan ................... 4-054366

[51] Int. Cl.⁶ .............................................. G11C 13/00
[52] U.S. Cl. .................... 365/230.01; 365/52; 365/189.09
[58] Field of Search ............... 365/52, 189.01, 189.09

[56] References Cited
U.S. PATENT DOCUMENTS 4,727,513  2/1988  Clayton .................... 365/52

OTHER PUBLICATIONS

Japanese Publication, Jeida, the IC Memory Card, Guideline Ver 4.1.

Primary Examiner—Terrell W. Fears

[57] ABSTRACT

A function of write protection against careless writing in a memory card is realized by means other than a mechanical switch. Existing address lines exceeding the capacity of a memory and an existing write control line are used as inputs to a gate circuit so that data can be written in the memory only in the case where a specific value can be decoded. Accordingly, a write address space is limited to a specific address space other than the lowermost address space. Accordingly, data cannot be written if the specific address space cannot be known. As a result, the function of write protection can be provided without using any switch and without introducing any nonstandardized terminal and any control signal.

4 Claims, 6 Drawing Sheets

MEMORY CARD

IMAGE OF ADDRESS SPACE

MEMORY CARD

IMAGE OF ADDRESS SPACE

MEMORY CARD

BACKGROUND OF THE INVENTION

The present invention relates to a memory card and particularly to means for carrying out a function of store protection in a memory card having a memory which is partly or wholly rewritable.

In general, this type memory card has a plurality of memory integrated circuits (integrating circuits or memory elements having storage functions, which are generically called "memory IC" in this specification) mounted therein so that a large-capacity memory is logically provided by allocating a series of addresses to these memory ICs.

That is, this type memory card is widely used apparently as one memory, as an ROM card where games for a game machine are stored, or a detachable card where programs or parameters for a control unit are stored.

The structure of this type memory card has been standardized by JEIDA (for example, the IC Memory Card Guideline Vet. 4.1) in which specifications for interfaces to external devices (for example, the relation between the number of address lines and the arrangement of terminals, the relation between the kinds of control signals and the arrangement of terminals, and so on) are defined.

The fundamental structure of this type memory card is shown in FIG. 6A provided as a block diagram. In the drawing, the reference numeral 1 designates a memory, 2 a data line, 3 a lower address line, 4 a write control signal line, 5 a switch, 6 a read control line, and 7 a chip select signal line.

The memory 1, as described above, has a plurality of memory ICs and an address decoder for selecting one therefrom, but is regarded as a large-capacity memory (for example, 1 Mbyte memory) in the block diagram.

The data line 2 is generally provided as an 8-bit data line having external terminals D0 to D7 through which data are transmitted bidirectionally between an external device and the memory 1.

The address line 3 is provided as an address line having 20 lines (external terminals A0 to A19) corresponding to the 1 Mbyte storage capacity of the memory 1. Through the external terminals A0 to A19, address data are transmitted from the external device to the memory 1.

According to the JEIDA Standard, one address is constituted by 26 bits. Accordingly, external terminals A20 to A25 are not connected anywhere (as represented by NC in FIG. 6A) though they are defined as terminals.

The write control line 4 serves to transmit a write control signal for controlling write timing from the external device to the memory 1 through an external terminal WE. The switch 5 is connected between the external device and the memory 1 so as to be inserted in the middle thereof.

The switch 5 is constituted by a mechanical switch which can be changed manually from the outside of the memory card.

Accordingly, in the case where the switch 5 is changed to an open state, the write control signal cannot be transmitted to the memory 1 so that write protection is established in the memory card.

The read control line 6 is provided as a line through which a read control signal for controlling read timing is transmitted. The chip select signal line 7 is provided as a line through which a chip select signal for selecting one memory card while distinguishing the memory card from other memory cards is transmitted in the case where such memory cards are connected to a plurality of external devices of the same structure.

Accordingly, the timing of reading data from the memory card to an external device is controlled by the lines 6 and 7, whereas the timing of reading data from an external device to the memory card to the external device is controlled by the lines 4, 6 and 8.

In the aforementioned structure, an image of address space in this type memory card is shown in FIG. 6B.

A 64-M address space is constituted by 64 pieces of 1-M address spaces by repeating an address space of "0" to "1048575" (hereinafter merely called lowermost 1-M space, in which M is given to each M-byte in the drawing) 64 times. This is caused by the fact that the external terminals A20 to A25 for transmitting the upper bits of an address from an external device are not connected anywhere. Accordingly, the lowermost 1-M space and the other 1-M spaces can be shown by repeating one address space of the mounted memory 1, so that the memory 1 can be accessed even in the case where any one of the 1-M spaces is accessed.

As described above, the memory card is often used as an ROM card. In this case, it is a matter of course that the memory 1 may be constituted by an ROM, because the memory constituted by a mask ROM is advantageous from the double point of view of cost and capacity.

For the purpose of facilitating correction, updating and so on in the feature, however, a rewritable memory, such as an RAM, a PROM, an EEPROM, or the like, may be used as part of the ROM.

Accordingly, not only the memory card provided as an RAM card is rewritable but the memory card provided as an ROM card may be rewritable. Game makers or machine makers can maintain balance between cost saving caused by mass production and answering to diversified needs, by providing memory cards to end users after applying necessary correction/updating to the memory cards by writing additional data (and so on) into ROM cards.

Because this type memory card serves as an ROM card in the user's place, this type memory card must be prohibited from being carelessly rewritten by users. Therefore, a function of memory protection against writing is required. In the aforementioned structure in the prior art, the switch 5 fulfills this function.

In the prior art, however, the function of memory protection is selected by a mechanically operated switch. Accordingly, the switch may be operated by mistake consciously or unconsciously, so that the state of the memory card may be turned to a write-enabled state. When some write access to a memory card is made by careless operation of an apparatus (or the like) in the condition where the memory card is in a write-enabled state, and particularly when the lowermost address space frequently used is accessed, rewriting may occur easily to bring an inconvenient situation where data are destroyed because all address spaces are in most cases folded so as to correspond to respective areas of the mounted memory.

Furthermore, because ordinary users comprehend that such an ROM card is not rewritable, it is unnatural to users that the memory card has the read/write selection switch provided so as to be able to be operated for the maker's convenience.

Furthermore, in the case where data to be stored in the memory card are secret data, it is inconvenient that users other than a specific user can read such data easily.

SUMMARY OF THE INVENTION

The present invention is therefore directed to solve the above problems in the prior art. A first object of the present invention is to provide a memory card having a structure in which data stored in the memory are protected even in the case where writing is carelessly applied to the memory. A second object of the present invention is to provide a memory card having an easy security function.

In addressing the foregoing objects, the memory card according to the present invention at least has: a memory; a decoder for decoding a predetermined value except zero; and a plurality of terminals through which a signal is transmitted between the memory card and an external device, in which among the plurality of terminals, some terminals receiving a signal for controlling writing/reading with respect to the memory from the external device are connected to part of the other terminals as input to the decoder so that the signal is transmitted to the memory through the decoder decoding the predetermined value.

In the memory card of the present invention having such a configuration as mentioned above, with respect to data writing, upper address lines (a second set of lines) which are not used as surplus ones are utilized so that the write control signal can be neglected when the value on these upper address lines are not a predetermined value other than "0". Accordingly, even in the case where any address space other than a specific address space is accessed, writing is prohibited because, in particular, "0" is made to be out of the object to be decoded, the lowermost address space cannot be accessed as the specific address space so that write protection can be made securely.

On the other hand, programs or the like given to users are generally formed so that access is made to the real memory. Accordingly, writing by mistake in operation occurs frequently in the lowermost address space having one-to-one correspondence with the mounted memory.

Accordingly, not only erroneous writing or the like by users can be substantially prevented but data can be written easily by makers which know well write-enabled address spaces.

With respect to data reading, upper address lines (a second set of lines) which are not used as surplus ones are utilized so that the write control signal can be neglected when the value on these upper address lines are not a predetermined value other than "0". Accordingly, it is possible to improve the security so that users except specific users who know read-enabled address spaces cannot read data illegally.

DESCRIPTION OF THE PREFERRED EMBODIMENTS

Figure 1A:
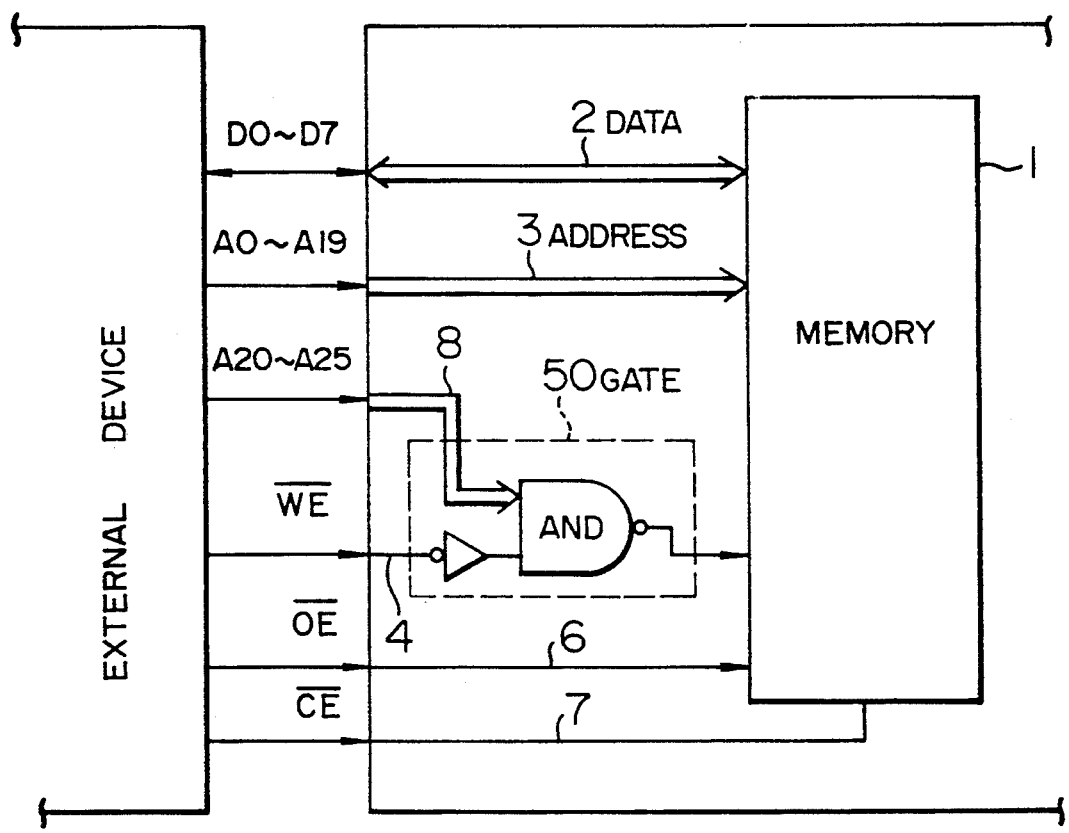
FIG. 1A is a block diagram showing an embodiment of the memory card according to the present invention.
Figure 6A:
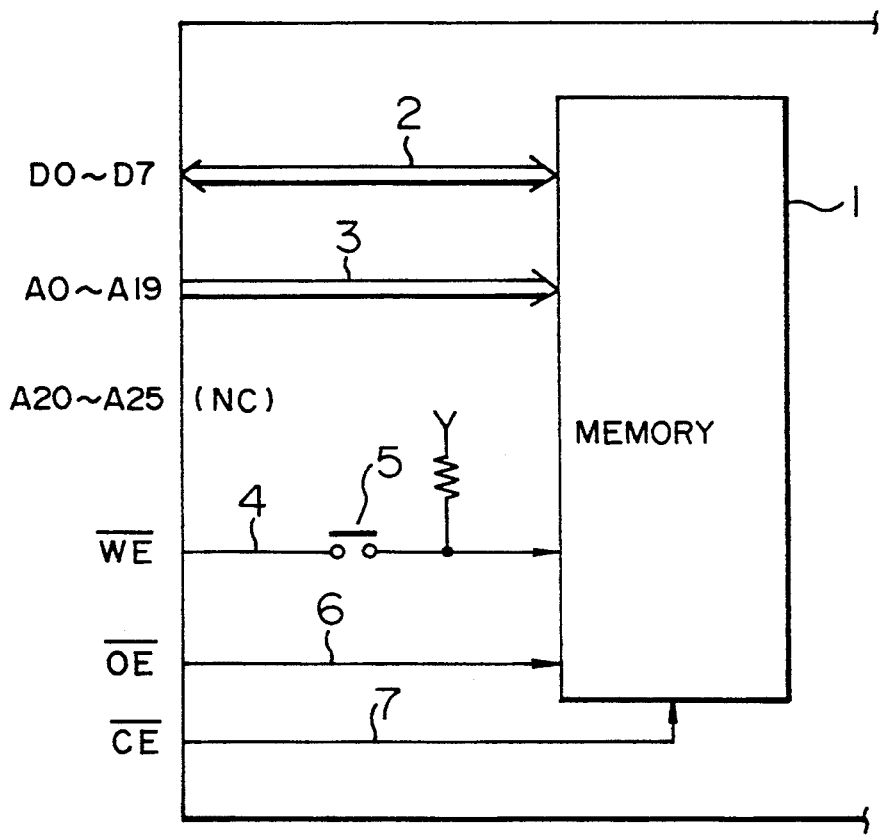
FIG. 6A is a block diagram showing the fundamental configuration of a conventional memory card.
Figure 6B:
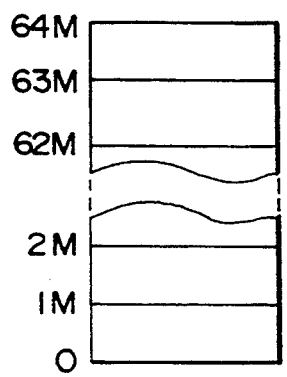
FIG. 6B is a diagram of an image of address space of the conventional memory card.

An embodiment of the memory card according to the present invention will be described below with reference to FIG. 1A which is a block diagram thereof. FIG. 1A corresponds to FIG. 6A which shows the prior art. In the drawing, the reference numeral 1 designates a memory, 2 a data line, 3 a lower address line, 4 a write control signal line, 6 a read control line and 7 a chip select signal line. The reference numeral 8 designates an upper address line, and 50 a gate circuit including a decoder.

In detail, the memory 1 is constituted by a plurality of memory ICs, an address decoder, and so on. In the fundamental block diagram, the memory 1 is shown as a large-capacity memory (for example, 1 Mbyte-memory). The detail will be described in other embodiments.

The data line 2 is provided as an 8-bit data line having external terminals D0 to D7 through which data are transmitted bidirectionally between an external device and the memory 1.

In this embodiment, the address line 3 is constituted by 20 lines corresponding to the 1 Mbyte-storage capacity of the memory 1. Through external terminals A0 to A19, address data are transmitted from the external device to the memory 1. The address lines are lower address lines corresponding to the read memory among 26 address lines defined by the JEIDA Standard. The address lines correspond to a first group of lines.

The write control line 4 serves to transmit a write control signal through an external terminal WE but is connected as input to the gate circuit 50, unlike the case of the prior art.

The switch (5) in the prior art is omitted here because the function of write protection is provided by other means. Accordingly, an unnatural feeling is not given to general users in the case where the memory card is used as an ROM card. For special users as know that the ROM card is generally provided as a partly rewritable memory, the function of write protection is to be increased more greatly by using the aforementioned switch in combination.

The line 6 is a line through which a read control signal for controlling read timing is transmitted. The line 7 is a line through which a chip select signal for selecting one memory card while distinguishing the memory card from other memory cards in the case where a plurality of memory cards are connected to one external device. These lines have the same configuration as in the prior art. Because not only the timing of reading from the memory card to the external device as controlled by the lines 6 and 7 is the same as in the prior art but the timing as controlled by the address line 3 is the same as in the prior art, reading is the same as in the prior art. There is no inconvenience.

The address line 8 serves to transmit an upper portion of an address from the external device through external terminals A20 to A25, and it is connected to the input of the decoder of the gate circuit 50. The address line 8 is constituted by upper address lines which do not correspond to the real memory among the 26 lines defined by the JEIDA Standard. These address lines correspond to a second group of lines. The whole addresses constituted by the address lines 3 and 8 have one-to-one correspondence with the addresses of the real memory 1 when the value on the address line 8 is "0".

It is fundamental that the gate circuit 50 is constituted by a decoder having the address line 8 as its input, an AND gate for receiving an output from the decoder and the write control signal as two input signals thereto, and so on. In this embodiment, the configuration of the circuit is simplified by selecting the decode value as "111111" (binary number) so that the decoder, the AND gate, and so on, are united into one body by using a multi-input NAND gate. An output from the gate circuit 50 is supplied, as a signal for controlling the timing of writing data into the memory, to the memory 1. Accordingly, the timing of writing data from the external device into the memory card is controlled on the basis of the lines 4, 7 and 8, so that writing of data into the memory 1 is prohibited if the value on the address line 8 is different from the specific value.

Figure 1B:
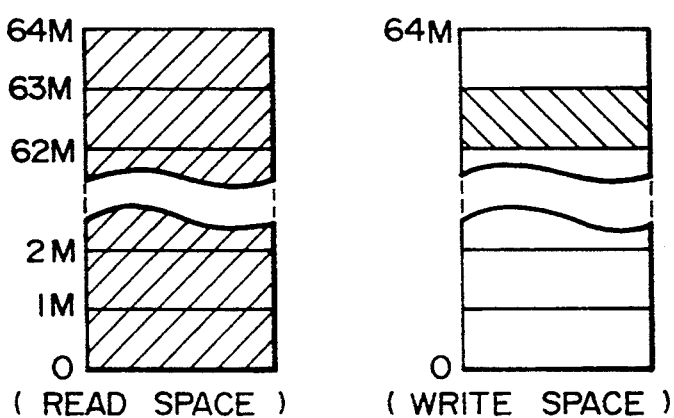
FIG. 1B is a diagram of an image of address space thereof.

In the aforementioned configuration, an image of address space in the memory card is shown in FIG. 1B.

A read address space is constituted by a 64-M address space constituted by 64 pieces of 1-M spaces by repeating the lowermost 1-M space (addresses "0" to "1048575") corresponding to the address space of the memory 1 64 times in the same manner as in the prior art. This is caused by the fact that the external terminals A20 to A25 for transmitting the upper bits of an address from an external device are connected to the decoder of the gate circuit 50 through the address line 8 and the external terminals A20 to A25 are not used for designation of the read address. Accordingly, each of the lowermost 1-M space and the other 1-M spaces shows address space corresponding to the real memory 1, so that the memory 1 can be accessed even in the case where any one of the 1-M spaces is accessed, in the same manner as in the prior art.

On the other hand, with respect to the write address space, the external terminals A20 to A25 for transmitting the upper bits of the address from the external device are connected to the decoder of the gate circuit 50 through the address line 8 to suppress the write control signal so as to be effectively used for limitation of the address at the time of data writing. Therefore, memory space is limited to the uppermost 1-M space when the value on the address line 8 is "111111" (binary number) as described above. Of course, if the value subjected to decoding by the decoder is another value, for example, "111110" (binary number), the memory space is limited to the 1-M space not smaller than 62M and smaller than 63M (see "write space" in FIG. 1B).

Accordingly, the 1-M space corresponding to the address space of the memory 1 is limited to one of the 64 pieces of 1-M spaces, so that data cannot be written in the memory 1 if the address space is unknown.

Furthermore, a value other than "0" is set as the decode value, so that the lowermost 1-M space most frequently accessed is considered as an object for write protection.

Accordingly, this is sufficient as a function of write protection against write error caused by mistake in operation which may occur usually.

Figure 2:
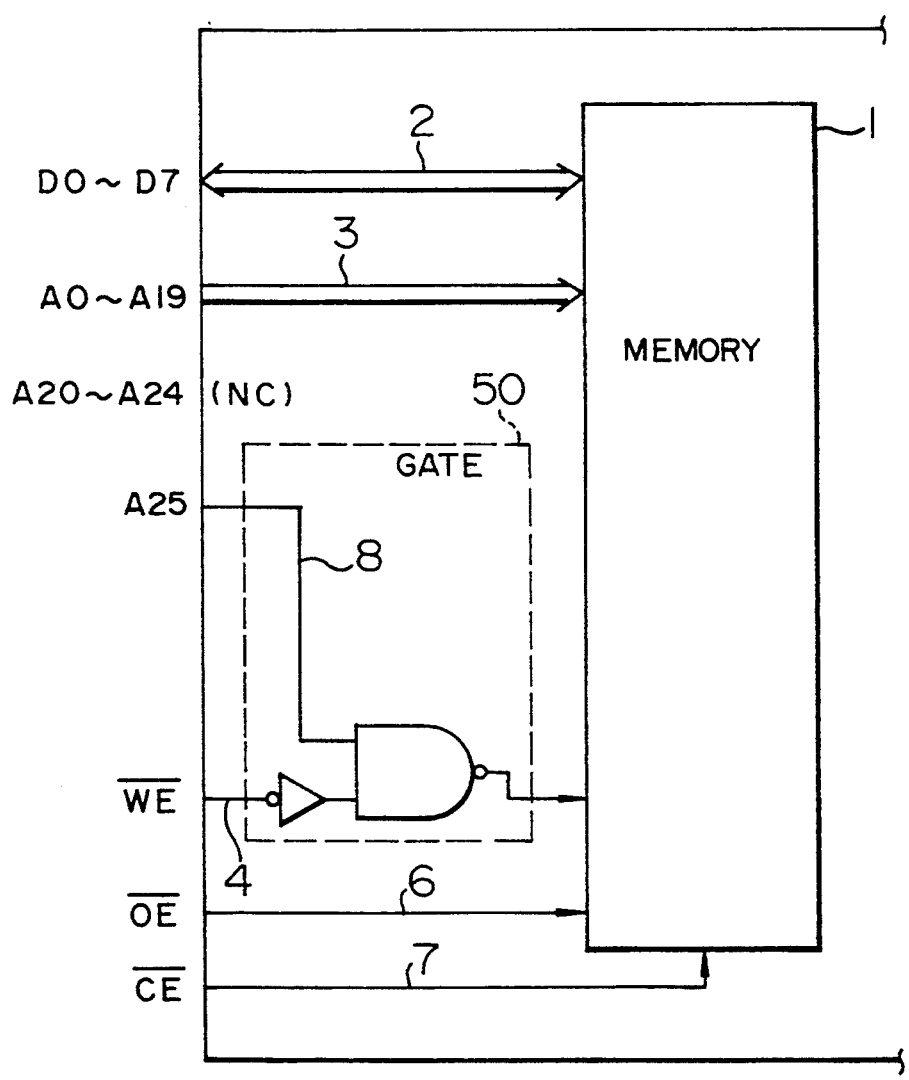
FIG. 2 is a block diagram for explaining the gate circuit in the memory card according to the present invention.
Figure 3:
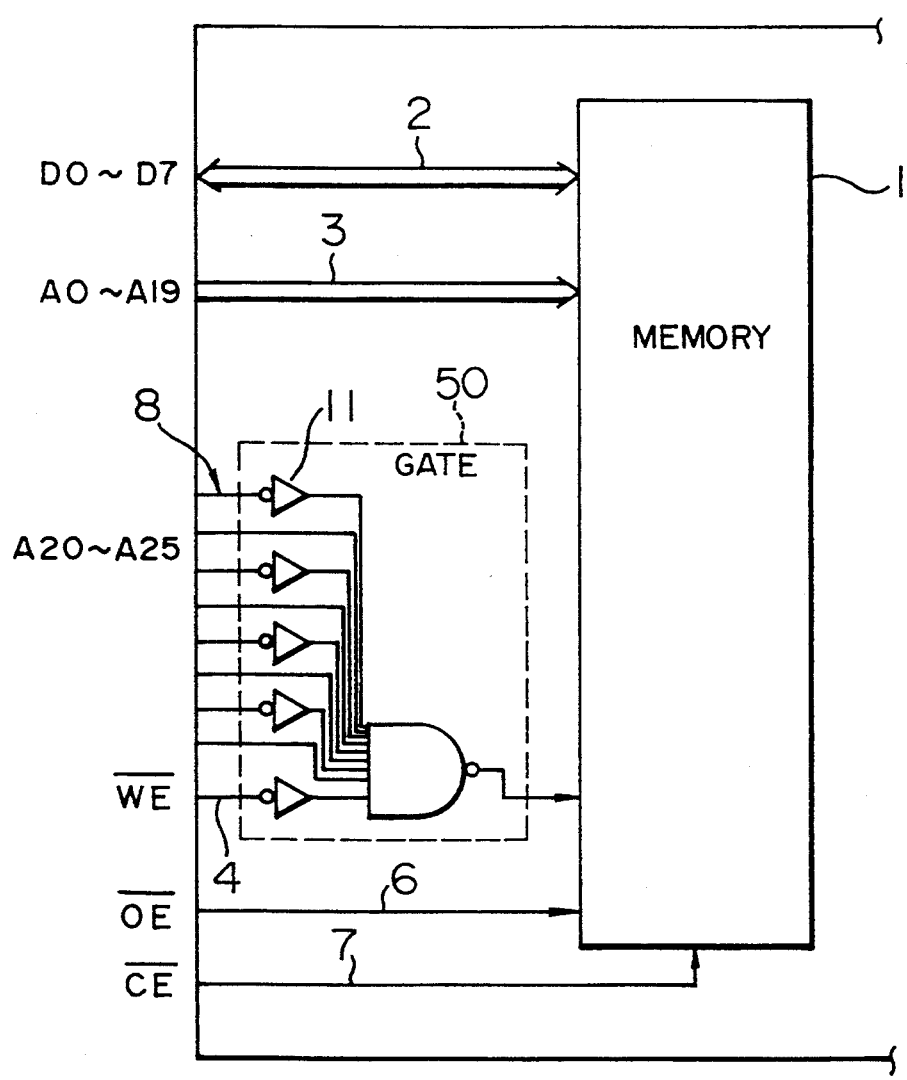
FIG. 3 is a block diagram for explaining the gate circuit in the memory card according to the present invention.

The gate circuit 50 will be described more specifically. As shown in FIG. 2, at least one address line (in this drawing, one address line from the terminal A25) among the upper address lines connected to the terminals A20 to A25 and a signal obtained by connecting an NOT gate to the write control signal line 4 are used as the inputs to the NAND gate. Alternatively, as shown in FIG. 3, not only all the upper address lines connected to the terminals A20 to A25 are used as the inputs to the NAND gate 10 but the lines connected to the terminals A20, A22 and A24 among the address lines connected to the terminals A20 to A25 are connected to the NAND gate through NOT gates 11. In this case, "101010" (binary number) is set as the decode value, and, at the same time, a signal for controlling the timing of writing data into the memory 1 is transmitted to the memory 1 when a write control signal is transmitted from the line 4.

By using address lines connected to the terminals A20 to A25 as shown in FIG. 3 and further combining NOT gates 11 suitably, writing of data into the memory 1 can be permitted only in the case where a specific decode value is provided. Accordingly, write protection can be preferably strengthened more greatly.

It is a matter of course that the gate circuit 50 is not limited to the above specific embodiments and that the same function can be obtained by any suitable one of other logical circuits and programs.

Figure 4:
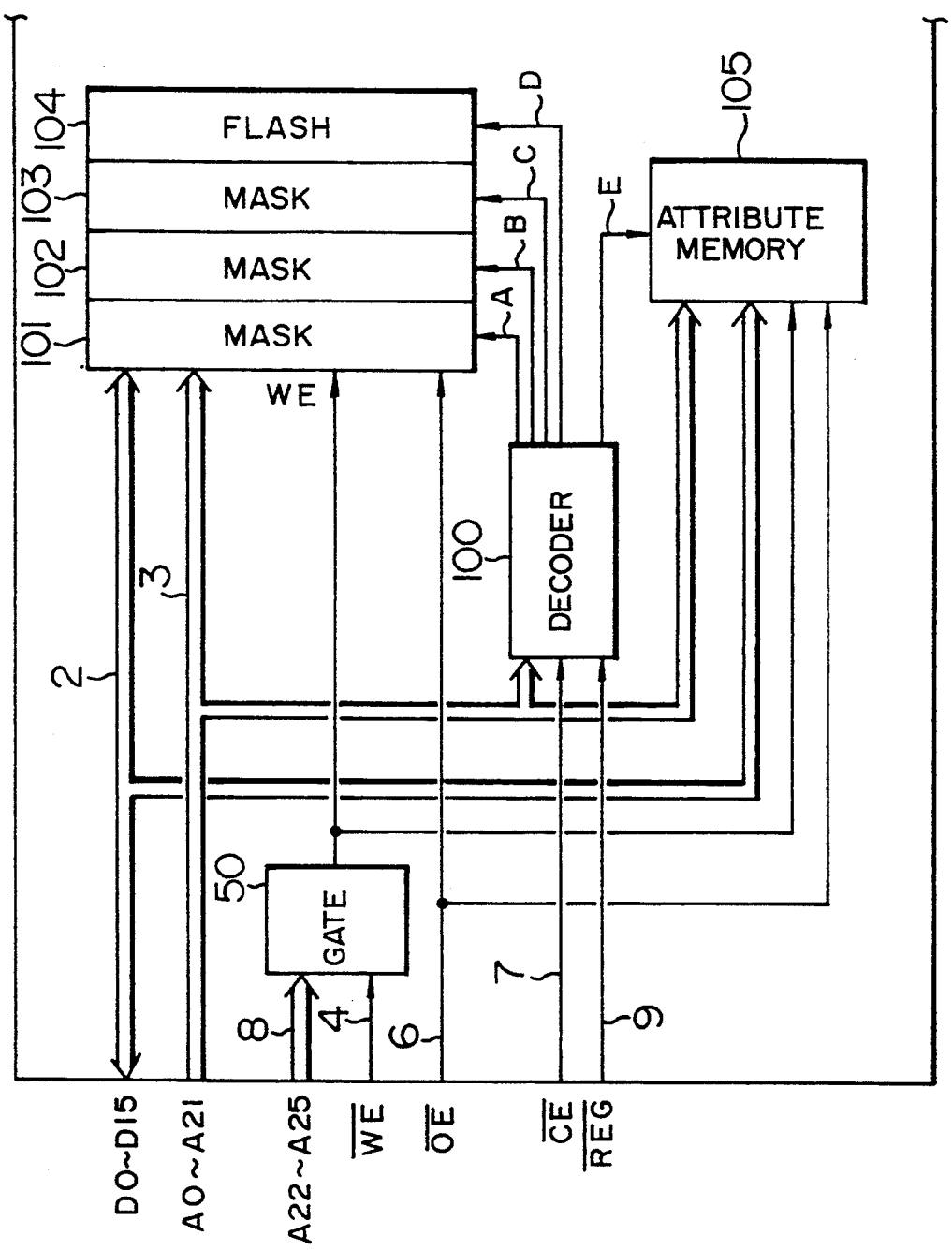
FIG. 4 is a detailed block diagram showing another embodiment of the memory card according to the present invention.

FIG. 4 is a detailed block diagram showing another embodiment according to the JEIDA Standard. In the drawing, the reference numeral 2 designates a data line, 3 a lower address line, 4 a write control signal line, 6 a read control line, 7 a chip select signal line, 8 an upper address line, and 50 a gate circuit including a decoder, in the same structure as in the previous embodiment. The reference numeral 9 designates a memory select signal line, 100 a decoder, 101 to 104 respectively 1 Mbyte-memory ICs, specifically, 101 to 103 mask ROMs, 104 a rewritable memory such as a flash memory, an EEPROM or the like, and 105 an attribute memory in which attribute information such as transmission speed of memory IC is stored.

The memory ICs constituted by mask ROMs 101 to 103 have not-rewritable memories in which a predetermined program such as a game program is stored. The memory IC 104 has a rewritable memory such as a flash memory in which the program can be stored after being rewritten partly.

Assuming now that the program in the not-rewritable memory ICs 101 to 103 is to be changed partly, then a signal for generating a specific decode value as described above is supplied from the external device to the terminals A22 to A25 and at the same time a write control signal is supplied from the gate circuit 50 to the memory ICs 101 to 104 through the line 4. Furthermore, at the same time, a signal for indicating an address of the rewritable memory IC 104 is supplied from the external device to the terminals A0 to A21 and at the same time a chip select signal is supplied through the line 7 so that a signal for designating a predetermined address of the memory IC 104 is supplied from the decoder 100 through the address line 3 and the chip select line 7 to thereby write an updated program in the rewritable memory IC 104. The program thus written in the memory ICs 101 to 104 can be read suitably through the lines 2 (D0 to D15), 3 (A0 to A21) and 6, as described above, at the time of data reading.

Although the aforementioned embodiment has been described upon the case where the memory ICs 101 to 103 are formed of mask ROMs to prevent rewriting of data, it is a matter of course that each of the memory ICs 101 to 103 may be formed of a rewritable memory such as an SRAM, a PROM, an EEPROM or the like.

Although above description has been made upon the case where the present invention is applied to main memories such as memory ICs 101 to 104, it is a matter of course that the present invention can be applied to an attribute memory in which attribute information such as main memory maker name, transmission speed, format, and so on, is stored.

In the following, the case where the present invention is applied to the attribute memory 105 will be described.

The decoder 100 and the attribute memory 105, as a whole, correspond to the memory (1) in the aforementioned embodiment. That is, in this embodiment, two sets of memories are provided. The capacity of the attribute memory 105 is relatively small compared with that according to the Standard. Further, a judgment as to whether the memory ICs 101 to 104 are to be accessed or whether the attribute memory 105 is to be accessed, is made by selection on the basis of the memory select signal on the line 9.

In detail, the chip select signal line 7, the memory select signal line 9 and the upper bit of the address line 3 are connected to the inputs of the decoder 100 so that the decoder 100 decodes the data thus inputted. Accordingly, one of signals A, B, C and D for respectively selecting the memory ICs 101, 102, 103 and 104 or a signal E for selecting the attribute memory 105 is outputted selectively so that the memory element (or the like) to be accessed can be selected.

Further, the output signal line of the gate circuit 50 receiving the data line 2, the address line 3, the read control line 6, the write control line 4 and the address line 8, is connected both to the memory ICs 101 to 104 and to the attribute memory 105.

Figure 5:
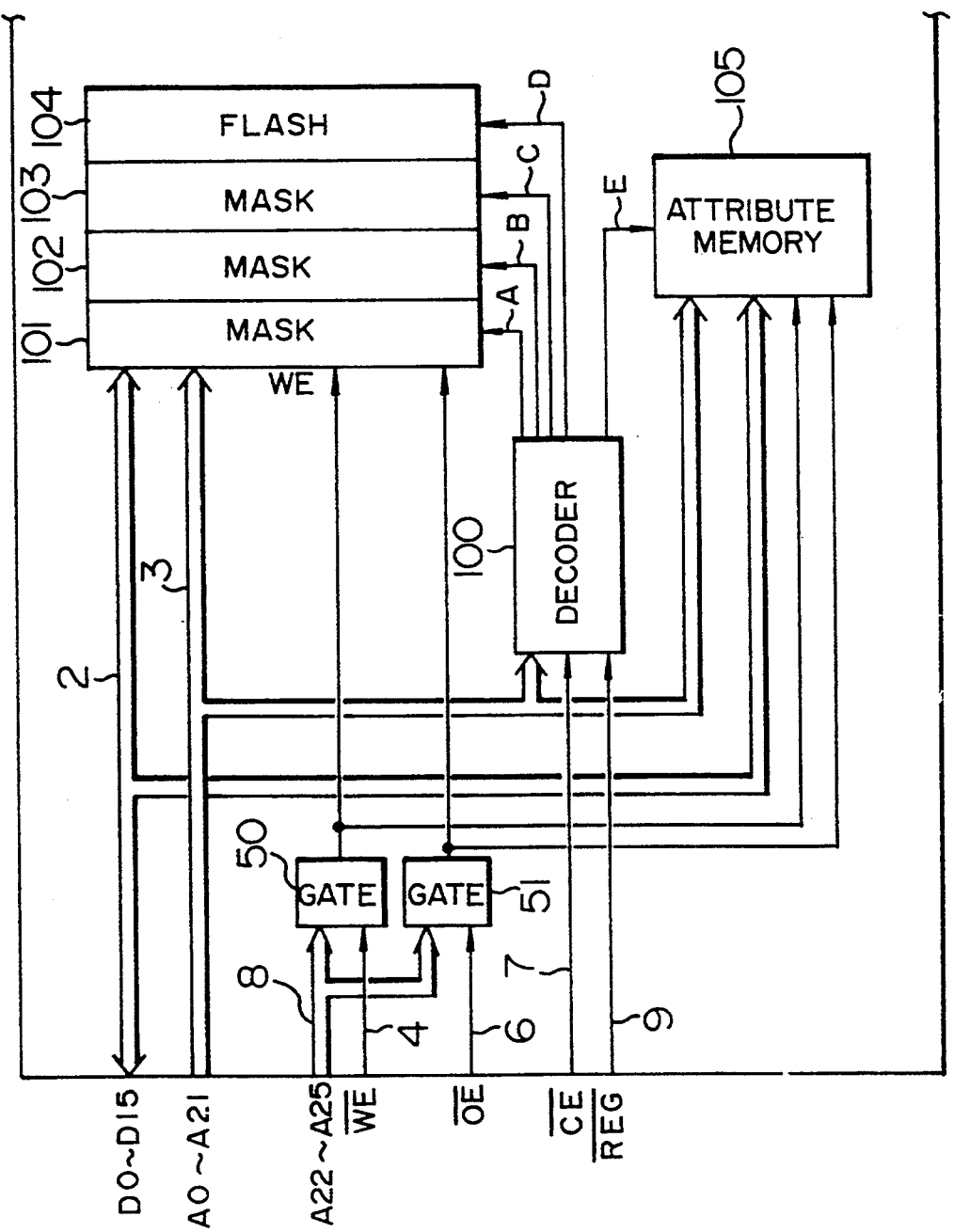
FIG. 5 is a block diagram showing a further embodiment of the memory card according to the present invention.

FIG. 5 is a block diagram showing an embodiment in which a function of read protection is provided in addition to the function of write protection. In this embodiment, a gate circuit 51 including a decoder for data reading is added to the previous embodiment and, at the same time, the address lines A22 to A25 and the read control line 6 are connected to the gate circuit 51 so that an output from the gate circuit is supplied, as a read control signal, both to the memory ICs 101 to 104 and to the attribute memory 105.

Accordingly, not only these functions of write protection are effective not only to the memory IC 101 to 104 but to the attribute memory 105.

Although this embodiment has shown the case where the gate circuit 50 is used in common to two memories, the present invention can be applied to the case where a plurality of gate circuits may be provided so that write protection can be strengthened more greatly through decoders respectively decoding different values. Further, it is easy that the address lines to be decoded are provided differently correspondingly to the respective sizes of the memories. When, for example, the address lines 3, inclusive of the upper-bit lines thereof, are decoded in the case where the memory capacity of the attribute memory 105 is relative small, write protection with respect to the attribute memory 105 storing significant information can be strengthened more greatly.

It is to be understood from the above description that a function of write protection is provided by using surplus existing address lines without introduction of any nonstandardized terminal and control signal. As a result, data stored in a memory is protected from being rewritten into the memory carelessly. Furthermore, it is not required that the switch for write protection is used. Accordingly, not only an unnatural feeling in use of the memory card as an ROM card can be eliminated but write protection can be strengthened more securely by using the write protection switch in combination.

It is claimed:

1. A memory card comprising: a partly rewritable memory; a plurality of address lines for receiving an address signal having an address space exceeding the capacity of said memory from an external device; a control line for receiving, from said external device, a control signal for controlling timing of writing/reading for said memory; and a decoder for decoding a predetermined value other than zero;

wherein in which: among said plurality of address lines, a first set of lines corresponding to an address space including the capacity of said memory are connected as address inputs to said memory and a second set of lines constituted by part or all said plurality of address lines other than said first set of lines and said control line are connected as inputs to said decoder so that said decoder decodes said predetermined value to thereby transmit said control signal to said memory.

2. A memory card according to claim 1, wherein said decoder is constituted by a gate circuit.

3. A memory card according to claim 1, wherein said memory is constituted by a rewritable memory and a not-rewritable memory.

4. A memory card according to claim 1, wherein said memory is an attribute memory.

* * * * *